US006847510B2

(12) United States Patent
Childress et al.

(10) Patent No.: US 6,847,510 B2
(45) Date of Patent: Jan. 25, 2005

(54) MAGNETIC TUNNEL JUNCTION DEVICE WITH BOTTOM FREE LAYER AND IMPROVED UNDERLAYER

(75) Inventors: Jeffrey R. Childress, San Jose, CA (US); Robert E. Fontana, Jr., San Jose, CA (US); Kuok San Ho, Cupertino, CA (US); Ching Hwa Tsang, Sunnyvale, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 199 days.

(21) Appl. No.: 10/256,722

(22) Filed: Sep. 27, 2002

(65) Prior Publication Data
US 2004/0061983 A1 Apr. 1, 2004

(51) Int. Cl.$^7$ .............................. G11B 5/39; G11C 11/16
(52) U.S. Cl. ............................. 360/324.2; 360/324.12; 365/158; 365/171
(58) Field of Search ................. 360/324.2, 324.12; 365/171, 173, 158

(56) References Cited
U.S. PATENT DOCUMENTS 5,650,958 A   7/1997   Gallagher et al.
5,898,547 A   4/1999   Fontana, Jr. et al.
5,898,548 A   4/1999   Dill et al.

Primary Examiner—Craig A. Renner
(74) Attorney, Agent, or Firm—Thomas R. Berthold

(57) ABSTRACT

A magnetic tunnel junction (MTJ) device usable as a magnetic memory cell or magnetoresistive sensor, such as a MTJ read head for magnetic recording, has the free ferromagnetic layer located on the bottom of the device, the bottom free layer being formed on a special underlayer. The MTJ read head may be a flux-guided head that uses the free layer as a flux guide for directing magnetic flux from the magnetic media to the sensing region of the MTJ. The special underlayer for the growth of the free layer is an alloy comprising Mn, one of Pt, Ni, Ir and Os, and an additive X selected from Ta, Al, Ti, Cu, Cr and V. Without the additive, the underlayer alloy is antiferromagnetic. The additive is present in an amount sufficient to render the alloy to have no magnetic ordering, i.e., it is neither antiferromagnetic nor ferromagnetic, but without substantially affecting the preferred crystalline texture and unit cell size so that the underlayer is well-suited as a growth-enhancing underlayer for the free layer.

19 Claims, 3 Drawing Sheets

MAGNETIC TUNNEL JUNCTION DEVICE WITH BOTTOM FREE LAYER AND IMPROVED UNDERLAYER

TECHNICAL FIELD

This invention relates in general to magnetic tunnel junction (MTJ) devices, and more particularly to an MTJ device with the free layer being the bottom ferromagnetic layer.

BACKGROUND OF THE INVENTION

Magnetic tunnel junction (MTJ) devices are comprised of two ferromagnetic layers separated by a thin insulating tunnel barrier layer and are based on the phenomenon of spin-polarized electron tunneling. The insulating tunnel barrier layer is thin enough that quantum mechanical tunneling occurs between the ferromagnetic layers. The tunneling phenomenon is electron-spin dependent, making the magnetic response of the MTJ device a function of the relative orientations and spin polarizations of the two ferromagnetic layers.

MTJ devices have been proposed as memory cells for use in nonvolatile magnetic random access memory (MRAM) arrays. In an MRAM the resistance of the MTJ memory cell is lowest when the magnetic moments or magnetization directions of both ferromagnetic layers are parallel, and is highest when the magnetic moments are antiparallel. The basic structure of an MTJ memory cell is described in IBM's U.S. Pat. No. 5,650,958, which also describes an MTJ memory cell wherein one of the ferromagnetic layers has its moment fixed or pinned by being exchange coupled with an antiferromagnetic layer and the other ferromagnetic layer is free to have its moment rotated parallel or antiparallel to the moment of the fixed ferromagnetic layer in the presence of an applied magnetic field.

MTJ devices have also been proposed as magnetic field sensors, such as magnetoresistive read heads in magnetic recording disk drives, as described in IBM's U.S. Pat. No. 5,898,548. In MTJ read heads the fixed ferromagnetic layer typically also has its moment pinned by an antiferromagnetic layer and oriented substantially perpendicular to the surface of the magnetic layer on the disk. However, unlike in an MRAM, in the absence of an applied magnetic field the moment of the free ferromagnetic layer is oriented substantially perpendicular to the moment of the fixed ferromagnetic layer, i.e., substantially parallel to the surface of the magnetic layer on the disk.

In MTJ read heads, it is possible that during the lapping process to form the air-bearing surface (ABS) of the air-bearing slider, the material from the ferromagnetic layers may smear at the ABS and short out across the tunnel barrier layer. In addition, many antiferromagnetic materials and the aluminum oxide typically used for the tunnel barrier can also corrode during the ABS lapping process. For this reason a flux-guided MTJ read head has been proposed, as described in IBM's U.S. Pat. No. 5,898,547, which is incorporated herein by reference. In the '547 patent, only the free ferromagnetic layer is exposed at the ABS, with the tunnel barrier layer, the fixed ferromagnetic layer and the antiferromagnetic layer having their edges recessed from the ABS.

FIG. 1 shows the prior art flux-guided MTJ read head of the '547 patent. The MTJ 100 includes the antiferromagnetic layer 116, the fixed ferromagnetic layer 118, the tunnel barrier layer 120 and the free ferromagnetic layer 132. The fixed ferromagnetic layer 118 is the bottom ferromagnetic layer and is formed on the antiferromagnetic layer 116. The tunnel barrier layer 120 is formed on the fixed layer 118 and the free ferromagnetic layer 132 is the top ferromagnetic layer and thus formed on the tunnel barrier layer 120. The free ferromagnetic layer 132 has its sensing edge 140 substantially coplanar with the sensing surface or ABS. However, the other layers of the MTJ 100 have their front edges recessed from the ABS. The free layer 132 thus serves both as the sensing ferromagnetic layer for sensing data from the magnetic layer on the disk and as a flux guide for directing the magnetic flux back to the tunnel barrier layer 120 of the MTJ 100. The layers 102, 104 are the top and bottom electrical leads, respectively, for the head. The bottom lead 102 is formed on the G1 gap layer of the head and the G2 gap layer separates the top lead 104 from magnetic shield S2. The material of G1 and G2 is an electrically insulating material, typically alumina. Alternatively, the bottom lead 102 may be formed directly on the first magnetic shield S1 and the second magnetic shield S2 may be formed on the second lead 104. The shields S1 and S2 are formed of Ni—Fe alloys or Ni—Fe—Co alloys and are electrically conducting, so that an electrically conductive path is provided through the shield S1 to bottom lead 102, perpendicualarly through the MTJ 100 to top lead 104 and the second shield S2. If the leads 102, 104 are in direct contact with shields S1, S2, respectively, then insulating material is still required at the front and back edges of the MTJ 100. The sensing surface or ABS may have a protective overcoat formed on it, such as a thin layer of amorphous diamond like carbon, as is known in the art to protect the head during contact with the disk.

A flux-guided MTJ read head as shown in FIG. 1, wherein the free ferromagnetic layer is on top, is not the most desirable type of structure because it requires deposition of the free layer following formation of the recessed layers in the MTJ, which causes a poor interface to the tunnel barrier or a flux guide which is too thin to be useful. The problem with forming the free ferromagnetic layer on the bottom is that the tunnel barrier layer becomes rough when the bottom free layer is grown on the conventional underlayer, typically Ta, which makes it difficult to form the tunnel barrier layer thin enough. In addition, it is desirable to position the free layer closer to the center of the shield-to-shield gap to avoid diversion of the signal flux into the shields. However, it is known that increasing the Ta underlayer thickness to achieve this free layer positioning does not improve the smoothness of the tunnel barrier layer.

What is needed is an MTJ device and in particular a flux-guided MTJ read head that does not suffer from the problems associated with having the free layer on the bottom.

SUMMARY OF THE INVENTION

The invention is a magnetic tunnel junction device with the free ferromagnetic layer located on the bottom of the device, the bottom free layer being formed on a special underlayer. The underlayer is an alloy comprising Mn, one of Pt, Ni, Ir and Os, and an additive X selected from Ta, Al, Ti, Cu, Cr and V. Without the additive, the alloy is antiferromagnetic. The additive is present in an amount sufficient to render the alloy to have no magnetic ordering, i.e., it is neither antiferromagnetic nor ferromagnetic, but without substantially affecting the preferred crystalline texture and unit cell size so that the underlayer is well-suited as a growth-enhancing underlayer for the free ferromagnetic layer. In one embodiment the device is an MTJ read head that has the special underlayer formed over the head's bottom magnetic shield and the free ferromagnetic layer deposited on the underlayer, with the underlayer being PtMnTa or PtMnAl, with Cr or Al present between about 5 and 20 atomic percent. The underlayer may be deposited on the bottom shield or on an adhesion layer, such as Ta, Cr, Ti, NiFe, Ru, or Cu, with the adhesion layer being deposited on the bottom shield. The PtMnCr or PtMnAl underlayer thickness is not critical to the smoothness of the tunnel barrier layer that is subsequently deposited on the free ferromagnetic layer. This allows the tunnel barrier to be made sufficiently thin to achieve the desired electrical resistance, and is also a significant advantage in an MTJ read head because by making the underlayer thicker the free ferromagnetic layer can be located substantially at the center of the gap between the top and bottom magnetic shields.

For a fuller understanding of the nature and advantages of the present invention, reference should be made to the following detailed description taken together with the accompanying figures.

DETAILED DESCRIPTION OF THE INVENTION

Figure 2:
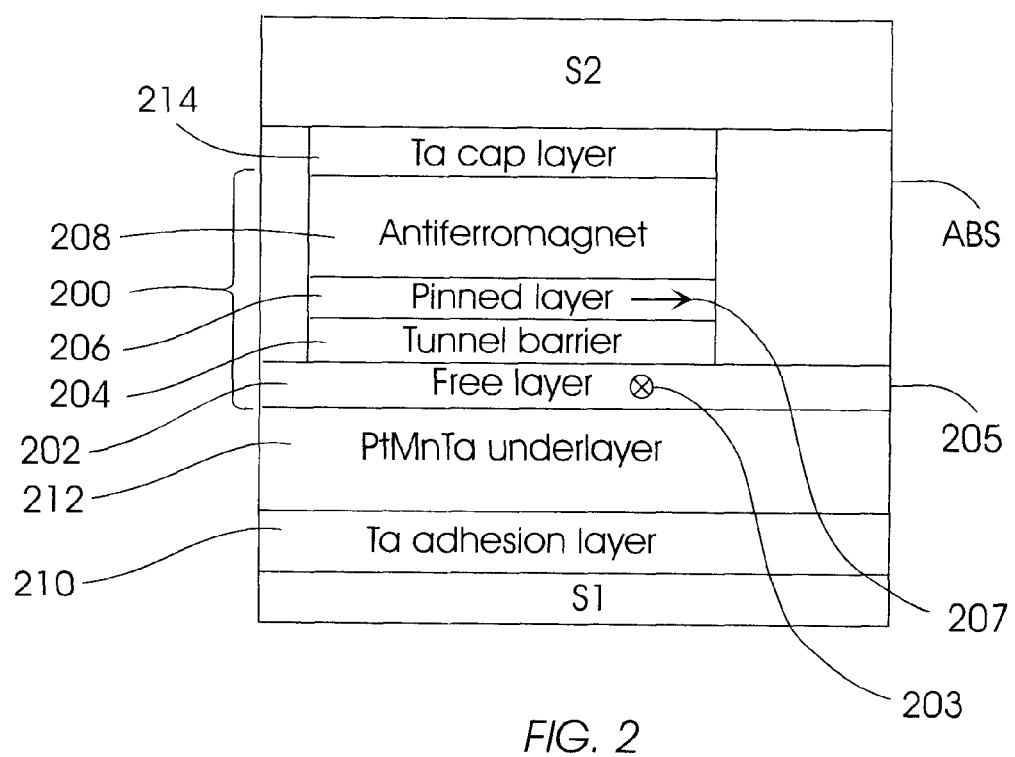
FIG. 2 is a sectional view of the flux-guided MTJ read head according to the present invention wherein the free ferromagnetic layer is on the bottom and is formed on an improved underlayer.

The MTJ device according to the present invention with the free layer on the bottom is fully applicable as a magnetic memory cell or as an MTJ read head without the use of the free layer as a flux guide, but is shown in FIG. 2 as a flux-guided MTJ read head. In FIG. 2, the MTJ 200 is an "inverted" structure with the free ferromagnetic layer 202 being the bottom ferromagnetic layer and formed on an improved underlayer 212. The underlayer 212 is a non-magnetically ordered Mn alloy, preferably PtMnTa, and is formed on a Ta adhesion layer 210 on top of the bottom magnetic shield S1. The MTJ 200 includes the free layer 202, the tunnel barrier layer 204, the pinned ferromagnetic layer 206 and the antiferromagnetic layer 208 exchange coupled with the pinned ferromagnetic layer 206 and a Ta cap layer 214. As shown, the free layer 202 has its front edge 205 coplanar with the ABS for sensing magnetically recorded data from the magnetic layer on the disk. The magnetic moment 207 of the pinned layer 206 is substantially perpendicular to the ABS and the magnetic layer on the disk and is pinned by being exchange coupled to the antiferromagnetic layer 208 so that it does not rotate when exposed to magnetic fields in the range of interest, i.e., the magnetically recorded data on the disk. The magnetic moment 203 of the free layer 202 is substantially parallel to the ABS and the magnetic layer on the disk in the absence of an applied magnetic field, but rotates slightly away from this orientation when exposed to magnetically recorded data.

Figure 1:
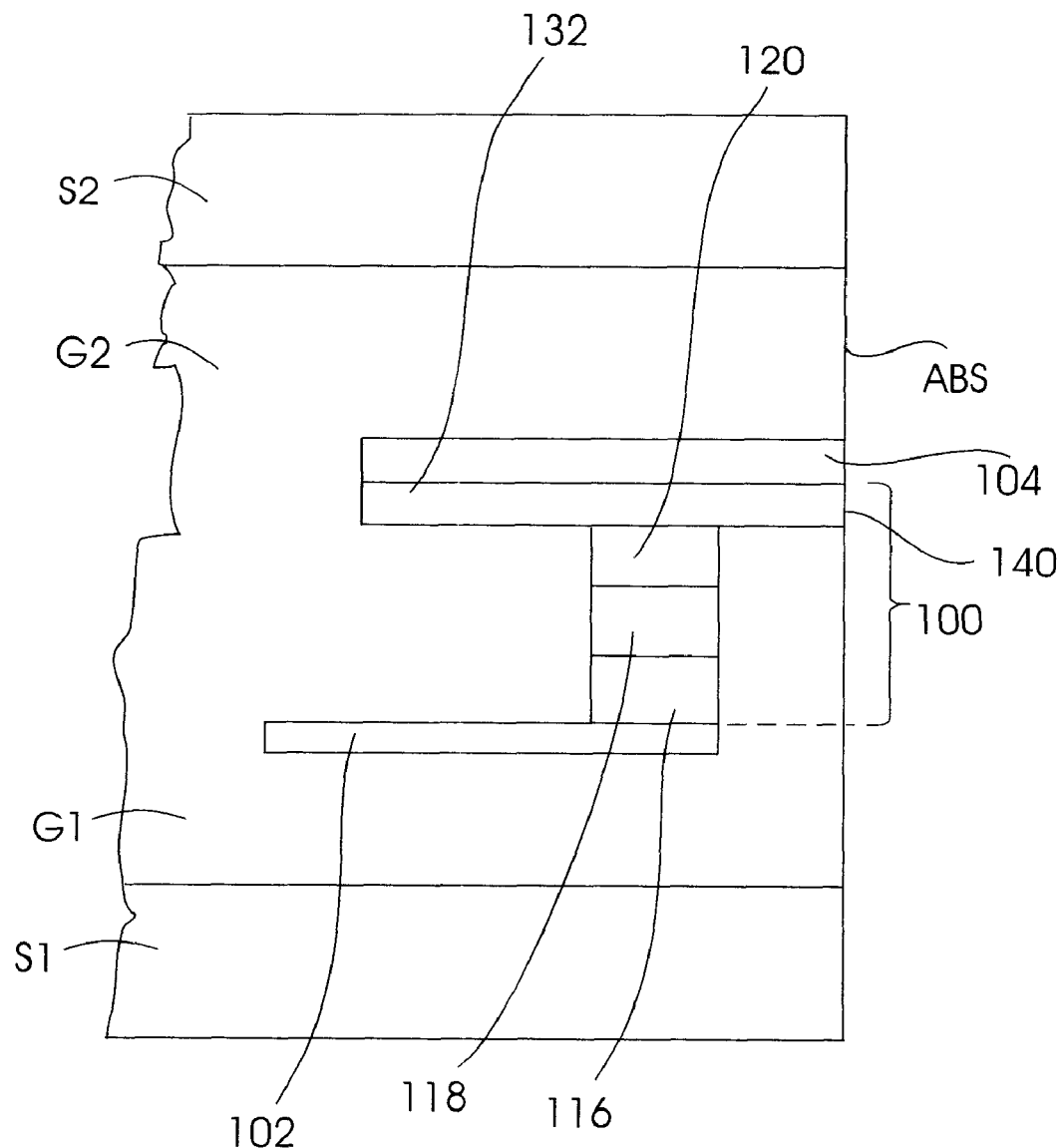
FIG. 1 is a sectional view of the flux-guided MTJ read head according to the prior art wherein the free ferromagnetic layer is on top.

Certain chemically-ordered Mn alloys, in particular $Pt_{50}Mn_{50}$ and $Ni_{50}Mn_{50}$, are used as antiferromagnetic pinning layers for the bottom fixed ferromagnetic layer in MTJ devices that have the free layer on top, such as the prior art structure of FIG. 1. These materials provide the necessary exchange coupling for pinning the magnetic moment of the fixed ferromagnetic layer, but also serve as useful underlayers for deposition of the fixed ferromagnetic layer. However, because these materials are magnetically ordered, i.e., they are antiferromagnetic, they can not be used as underlayers for the free ferromagnetic layer in MTJ devices with the free layer on the bottom because the exchange coupling would render the free layer inoperative.

In the present invention, the MTJ device is one with the free layer on the bottom in which the free layer is deposited on a Mn alloy underlayer that is not magnetically ordered. The preferred underlayer material is a PtMn alloy to which relatively small amounts of a third element, preferably Ta or Al, are added in an amount sufficient to render the alloy non-magnetically ordered. Such an underlayer has no antiferromagnetic properties (or ferromagnetic properties) but retains its suitability for the growth of the subsequently deposited ferromagnetic layer.

The Ta or Al is added in small quantities (less than about 20 atomic %) to quench the antiferromagnetic properties of the $Pt_{50}Mn_{50}$ while retaining its crystalline texture and interface. The result is a smoother free layer and tunnel barrier layer. A smoother tunnel barrier allows the fabrication of MTJ devices with thinner barriers, and therefore lower tunnel junction resistance required for magnetoresistive read heads. The underlayer thickness does not significantly alter the smoothness of the tunnel barrier layer. This permits the underlayer thickness to be chosen to center the free ferromagnetic layer in the gap to avoid diversion of the signal flux into the shields.

Figure 3:
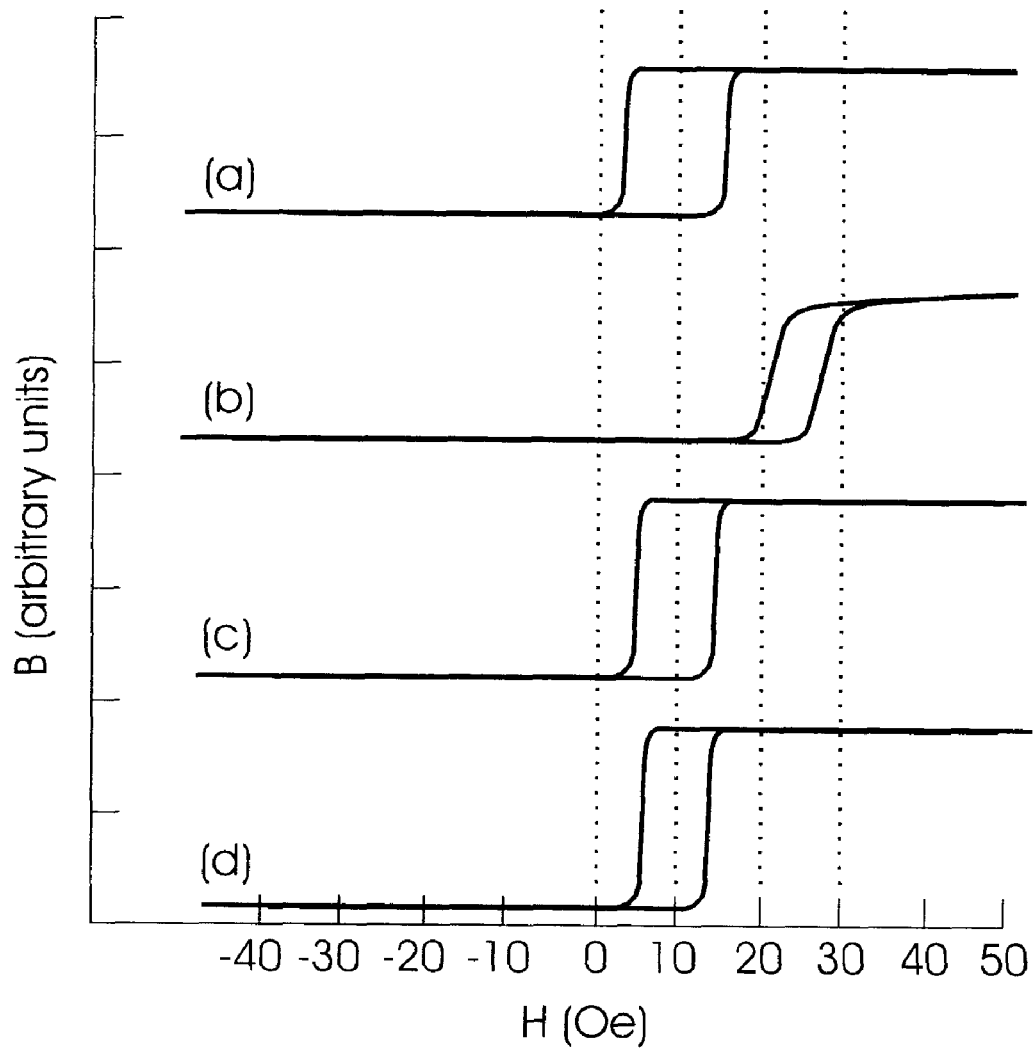
FIG. 3 shows a series of hysteresis loops to demonstrate the coupling field in the MTJ devices of the present invention as compared to prior art MTJ devices.

One well-known method to gauge the smoothness of a tunnel barrier in a MTJ device is to measure the magnetostatic coupling field between free layer and pinned layer. For a smoother barrier, less magnetic poles are formed at the interfaces between the free layer, the tunnel barrier and the pinned layer, resulting in a lower magnetostatic coupling field between the free and pinned layer magnetizations. The coupling field for the free layer is found by measuring the shift of the free layer magnetic hysteresis loop from zero magnetic field. FIG. 3 shows the free layer hysteresis loop for MTJ devices with identical alumina ($Al_2O_3$) tunnel barriers formed by oxidizing 6.5 Å of Al metal in 500 mTorr of oxygen for 15 minutes.

FIG. 3(a) shows the loop obtained for a top free layer structure of:

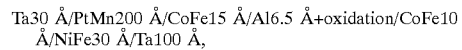

with a free layer coupling field of about 9 Oe.

FIG. 3(b) shows the loop obtained for a bottom free layer structure of:

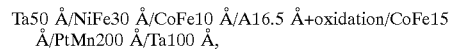

with a high free layer coupling field of about 24 Oe due to higher tunnel barrier roughness.

FIG. 3(c) shows the loop for an identical bottom-free layer structure as in FIG. 3(b), except that an underlayer of $(Pt_{50}Mn_{50})_{95}Ta_5$ 150 Å is formed on the Ta50 Å, with the free layer being formed on the PtMnTa alloy underlayer. The coupling field is 9 0e, comparable to that for the top free layer structure of FIG. 3(a). FIG. 3(d) shows the loop for an identical bottom-free layer structure as in FIG. 3(b), except that an underlayer of $(Pt_{50}Mn_{50})_{95}Al_5$ 150 Å is formed on the Ta50 Å, with the free layer being formed on the PtMnAl alloy underlayer. Again, the coupling field is about 9 0e.

Measurements of the coupling field for the structures of FIG. 3(c) were also made with different PtMnTa thicknesses. The results showed that the coupling field is essentially unchanged between 50 Å and 150 Å thicknesses of the PtMnTa. This is important because it shows that the PtMnTa underlayer thickness is not critical, which gives additional flexibility to position the free layer at the appropriate location in the gap between the magnetic shields.

While the present invention has been demonstrated with underlayers of non-magnetically ordered alloys of PtMnTa and PtMnAl, other additive elements can be substituted for Ta or Al. These include Ti, Cu, Cr and V. In addition, because $Ni_{50}Mn_{50}$ and $(PtPd)_{50}Mn_{50}$ are also chemically ordered antiferromagnetic materials that exhibit the same suitable underlayer properties as $Pt_{50}Mn_{50}$, the invention is believed extendible to underlayers based on these alloys as well. Iridium-manganese (IrMn) and osmium-manganese (OsMn) alloys are also Mn alloys that are antiferromagnetic, but unlike PtMn and NiMn, are not chemically ordered. However, they provide suitable underlayer properties so that if rendered to be not antiferromagnetic by the addition of an additive element, would also function as suitable underlayers for the free layer in bottom free layer MTJ devices. For each specific alloy and additive the optimum amount of additive, i.e., the minimum amount required to quench the antiferromagnetic property of the alloy, can be determined experimentally. For PtMnX, where X is either Ta or Al, this amount is approximately 5 atomic %. The amount of additive can be increased above this optimum amount, but as the amount increases, the alloy loses its preferred crystalline texture and unit cell size and thus becomes less well-suited as a growth-enhancing underlayer for the free ferromagnetic layer. In addition, if the underlayer is thinner than the so-called critical thickness of the antiferromagnetic (about 150 Å in the case of $Pt_{50}Mn_{50}$), less additive will be required to render the underlayer non-antiferromagnetic. In the extreme case where the underlayer can be made very thin (on the order of 40 Å or less for $Pt_{50}Mn_{50}$), then no additive is necessary as the underlayer becomes naturally non-antiferromagnetic due to its reduced thickness.

The embodiment described and shown in FIG. 2 has a layer of Ta as an adhesion layer between the S1 substrate and the underlayer. However, an adhesion layer is not required and the improved underlayer may be formed directly on the S1 substrate. In addition, if an adhesion layer is used, other adhesion layer materials include Cr, Ti, NiFe, Ru, and Cu.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A magnetic tunnel junction device comprising:
   a substrate;
   an underlayer on the substrate and formed of an alloy comprising:
   a) Mn,
   b) one of Pt, Ni, Ir and Os, and
   c) X, where X is selected from the group consisting of Ta, Al, Ti, Cu, Cr and V;
   and wherein the underlayer has substantially no magnetic order;
   a free ferromagnetic layer on and in contact with the underlayer and having its magnetic moment free to rotate in the presence of an applied magnetic field in a predetermined range;
   a tunnel barrier on the free layer; and
   a fixed ferromagnetic layer on the tunnel barrier and having its magnetic moment fixed in a preferred direction in the presence of an applied magnetic field in the predetermined range.

2. The device according to claim 1 wherein the alloy comprises PtMnX.

3. The device according to claim 2 wherein the alloy further comprises Pd.

4. The device according to claim 2 wherein X is Ta or Al.

5. The device according to claim 4 wherein the Ta or Al is present in the alloy in an amount greater than 5 atomic percent.

6. The device according to claim 1 further comprising an antiferromagnetic layer on and in contact with the fixed ferromagnetic layer for pinning the magnetic moment of the fixed ferromagnetic layer in said preferred direction.

7. The device according to claim 1 wherein the device is a magnetic memory cell.

8. The device according to claim 1 wherein the device is a magnetoresistive sensor.

9. The device according to claim 8 wherein the sensor is a magnetic recording read head.

10. The device according to claim 1 further comprising an adhesion layer selected from the group consisting of Ta, Cr, Ti, NiFe, Ru, and Cu on the substrate and wherein the underlayer is formed on the adhesion layer.

11. A magnetic tunnel junction magnetoresistive read head for sensing data magnetically recorded on a medium, the head having a substantially planar sensing surface that is aligned generally parallel to the surface of the medium when the magnetically recorded data is being sensed, the head comprising:
    a substrate having an edge forming part of the sensing surface;
    an underlayer on the substrate and formed of an alloy comprising:
    a) Mn,
    b) one of Pt, Ni, Ir and Os, and
    c) X, where X is selected from the group consisting of Ta, Al, Ti, Cu, Cr and V;
    and wherein the underlayer has substantially no magnetic order;
    a sensing ferromagnetic layer on and in contact with the underlayer and having a sensing edge substantially coplanar with the sensing surface, the magnetization direction of the sensing ferromagnetic layer being free to rotate in the presence of a magnetic field from the medium;
    an insulating tunnel barrier layer on and in contact with the sensing ferromagnetic layer; and
    a fixed ferromagnetic layer on and in contact with the tunnel barrier layer; and
    an antiferromagnetic layer on and in contact with the fixed ferromagnetic layer for pinning the magnetization direction of the fixed ferromagnetic layer in a direction substantially perpendicular to the sensing surface, whereby the magnetization direction of the fixed ferromagnetic layer is substantially prevented from rotation in the presence of a magnetic field from the medium.

12. The head according to claim 11 wherein the alloy comprises PtMnX.

13. The head according to claim 12 wherein the alloy further comprises Pd.

14. The head according to claim 12 wherein X is Ta or Al.

15. The head according to claim 14 wherein the Ta or Al is present in the alloy in an amount greater than 5 atomic percent.

16. The head according to claim 11 wherein the tunnel barrier layer has a front edge recessed from the sensing surface.

17. The head according to claim 11 wherein the fixed ferromagnetic layer and the antiferromagnetic layer have substantially coplanar front edges recessed from the sensing surface.

18. The head according to claim 11 wherein the front edges of the fixed ferromagnetic layer and the antiferromagnetic layer are substantially coplanar with the front edges of the tunnel barrier layer.

19. The device according to claim 11 further comprising an adhesion layer selected from the group consisting of Ta, Cr, Ti, NiFe, Ru, and Cu on the substrate and wherein the underlayer is formed on the adhesion layer.

* * * * *